(12) United States Patent
Möench et al.

(10) Patent No.: US 10,159,113 B2
(45) Date of Patent: Dec. 18, 2018

(54) HEATING SYSTEM COMPRISING SEMICONDUCTOR LIGHT SOURCES

(71) Applicant: KONINKLIJKE PHILIPS N.V., Eindhoven (NL)

(72) Inventors: Holger Möench, Vaals (NL); Guenther Hans Derra, Aachen (DE); Stephan Gronenborn, Aachen (DE); Pavel Pekarski, Aachen (DE); Johanna Sophie Kolb, Aachen (DE); Ralf Gordon Conrads, Kempen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 96 days.

(21) Appl. No.: 15/111,023

(22) PCT Filed: Jan. 9, 2015

(86) PCT No.: PCT/EP2015/050359
§ 371 (c)(1),
(2) Date: Jul. 12, 2016

(87) PCT Pub. No.: WO2015/107009
PCT Pub. Date: Jul. 23, 2015

(65) Prior Publication Data
US 2016/0381732 A1     Dec. 29, 2016

(30) Foreign Application Priority Data

Jan. 17, 2014  (EP) ..................................... 14151613

(51) Int. Cl.
*H05B 3/00* (2006.01)
*H01L 21/67* (2006.01)
(Continued)

(52) U.S. Cl.
CPC ........... *H05B 3/0047* (2013.01); *C23C 16/46* (2013.01); *C23C 16/481* (2013.01);
(Continued)

(58) Field of Classification Search
CPC ............ C23C 18/182; C23C 18/18162; C23C 18/2023; C23C 16/456; C23C 16/481;
(Continued)

(56) References Cited

U.S. PATENT DOCUMENTS

| 4,047,496 A | 9/1977 | McNeilly |
| 6,451,152 B1 | 9/2002 | Holmes |

(Continued)

FOREIGN PATENT DOCUMENTS

| JP | 2003077852 A | 3/2003 |
| JP | 2003077857 A | 3/2003 |
| JP | 2006059931 A | 3/2006 |

OTHER PUBLICATIONS

Gronenborn, S. et al., "Optical Components and Optical Systems for VCSEL Diode Laser Systems", 2012 THOSS Media & De Gruyter, Adv. Opt. Techn. 2012; 1(5): 389-396.

*Primary Examiner* — Shawntina Fuqua
(74) *Attorney, Agent, or Firm* — Larry Liberchuk

(57) ABSTRACT

The invention describes a heating system (100) and a corresponding method of heating a heating surface (180) of an object (150, 950) to a processing temperature of at least 100° C., wherein the heating system (100) comprises semiconductor light sources (115), and wherein the heating system (100) is adapted to heat an area element of the heating surface (180) with at least 50 semiconductor light sources (115) at the same time. The heating system (100) may be part of a reactor for processing semiconductor structures. The light emitted by means of the semiconductor light sources (115) overlaps at the heating surface (180).

(Continued)

Differences of the characteristic of one single semiconductor light source (115) may be blurred at the heating surface (180) such that a homogeneous temperature distribution across a processing surface of a, for example, wafer may be enabled.

13 Claims, 10 Drawing Sheets

(51) Int. Cl.

| | | |
|---|---|---|
| C23C 16/46 | (2006.01) | |
| C23C 16/48 | (2006.01) | |
| C30B 23/06 | (2006.01) | |
| C30B 25/10 | (2006.01) | |
| H01L 51/56 | (2006.01) | |
| H05B 1/02 | (2006.01) | |

(52) U.S. Cl.
CPC .......... *C30B 23/063* (2013.01); *C30B 25/105* (2013.01); *H01L 21/67115* (2013.01); *H01L 51/56* (2013.01); *H05B 1/0233* (2013.01)

(58) Field of Classification Search
CPC .. C23C 16/0209; H05B 3/0047; H05B 3/143; H05B 1/0233; C30B 23/063; C30B 25/105; C30B 31/12; H01L 21/67115; H01L 21/67098; H01L 51/56; F27B 17/0025

See application file for complete search history.

(56) References Cited

U.S. PATENT DOCUMENTS

| | | |
|---|---|---|
| 7,015,422 B2 | 3/2006 | Timans |
| 8,222,574 B2 | 7/2012 | Sorabji |
| 2002/0137311 A1 | 9/2002 | Timans |
| 2002/0137331 A1 | 9/2002 | Timans |
| 2004/0026400 A1 | 2/2004 | Ptak |
| 2005/0008351 A1 | 1/2005 | Gat |
| 2010/0038833 A1 | 2/2010 | Kasai |
| 2010/0267174 A1 | 10/2010 | Moffatt |
| 2011/0189602 A1 | 8/2011 | Tadakoro |
| 2012/0106585 A1 | 5/2012 | Wang |

HEATING SYSTEM COMPRISING SEMICONDUCTOR LIGHT SOURCES

FIELD OF THE INVENTION

The invention relates to a heating system comprising semiconductor light sources for directly or indirectly heating an object like an OLED substrate, a semiconductor wafer or the like. The invention further relates to a corresponding method of heating the object.

BACKGROUND OF THE INVENTION

Deposition of organic and inorganic semiconductor structures needs as homogeneous temperature distribution as possible. Variations of the processing temperature of some degree across, for example, a semiconductor wafer changes the growth conditions and thus the characteristics of the grown semiconductor layer. An example is the growth of LEDs emitting visible light on the basis of GaN. The growth temperature above 1000° C. has to be maintained within 0.5° C. in order to avoid wavelength shifts of the LEDs which in consequence require costly binning of products.

U.S. Pat. No. 8,222,574 B2 discloses, for example, an apparatus and a corresponding method for achieving uniform heating or cooling of a substrate during a rapid thermal process. The apparatus includes a thermal mass or plate adjacent to an edge ring to heat or cool the edge ring for controlling the temperature of the edge ring. Heat sources like laser diodes may be used to heat the edge ring and/or the substrate. The reliability and homogeneity of the heating process of the apparatus is still unsatisfactorily.

US 2010/0038833 A1 discloses an annealing apparatus comprising a multitude of LEDs, which is free from a problem of reduced light energy efficiency resulted by the reduction of light emission amount due to a heat generation and capable of maintaining stable performance.

SUMMARY OF THE INVENTION

It's thus an object of the present invention to provide an improved heating system, an improved reactor comprising such a heating system and a corresponding method of heating.

According to a first aspect a heating system for heating a heating surface of an object to a processing temperature of at least 100° C. is provided. The heating system comprises semiconductor light sources, wherein the heating system is adapted to heat an area element of the heating surface by receiving radiation from at least 50 semiconductor light sources at the same time.

An area element is heated by a specific semiconductor light source if the intensity received by the area element from the specific semiconductor light source is $1/e^2$ of the maximum intensity emitted by the specific light source (e Euler number 2, 71 . . . ).

The heating system may be part of a reactor for processing semiconductor structures. The heating system may be integrated in a reactor chamber of the reactor. Alternatively the heating system may be positioned outside the reactor chamber.

The object may be an OLED substrate (glass, plastic wafer or foils etc. . . . ), a semiconductor wafer (Si, GaAs etc. . . . ) or a carrier like a susceptor on which one or more of such wafers may be placed for processing semiconductor layers. The processing temperature strongly depends on the material to be processed like a plastic or Si wafer. In OLED processing temperatures of 100° C., 150° C. or 200° C. may be preferred. Processing of GaAs may require a processing temperature above 500° C., wherein the processing of InGaN layers used for LED fabrication may require even processing temperatures above 1000° C.

Semiconductor light sources like Vertical Cavity Surface Emitting Lasers are used to illuminate the heating surface of the object. The optical energy provided by the semiconductor light sources heats a processing surface to the desired temperature. The processing surface may be at least partly identical with the heating surface. The processing surface of a wafer may in this case be directly illuminated by means of the semiconductor light sources. Alternatively, the heating surface and the processing surface may be separate surfaces. The backside of a wafer may, for example, be illuminated by means of the semiconductor light sources and the front side of the wafer may comprise the processing surface. Furthermore, one or more wafers may be placed on a carrier like a graphite susceptor. At least a part of one side of the carrier may be illuminated by means of the semiconductor light sources such that the wafer provided on the opposite side of the carrier are indirectly heated to the desired temperature. The heating system may provide a homogenous temperature distribution of the processing surface by illuminating an area element of the heating surface with at least 50 semiconductor light sources at the same time. The light emitted by means of the semiconductor light sources overlaps at the heating surface. Differences of the characteristic of one single semiconductor light source may be blurred at the heating surface such that a homogeneous temperature distribution across the processing surface may be enabled. Furthermore, reliability of the heating system may be improved because failure of one semiconductor light source may cause only a minor change of the optical power provided by the semiconductor light sources to the area element. It may thus be advantageous to provide 100, 200, 500, 1000 or more semiconductor light sources to heat an area element of the heating surface at one moment in time. An increased number of light sources may reduce the power requirements regarding the single semiconductor light source. It may in this case be possible to use medium power semiconductor light sources even in high temperature applications with processing temperatures of 800° C., 900° C. or even more than 1000° C.

The semiconductor light sources may heat only a part of the heating surface at one moment in time such that scanning of the heating surface is needed. The area element illuminated by means of the semiconductor light sources changes by moving the object and the semiconductor light sources relative to each other. Alternatively, an optical element like a mirror may be arranged to move such that the heating surface can be illuminated by means of the reflected light emitted by the semiconductor light sources.

In another static approach the relation of the size of heating surface and the number of semiconductor light sources may be chosen in a way that the whole heating surface can be heated at one moment in time such that all area elements of the heating surface are illuminated by means of at least 50 semiconductor light sources at the respective moment in time. The static approach may have the advantage that no expensive and possibly error-prone mechanical device is needed in order to move the illumination beam emitted by the semiconductor light sources. Furthermore, there is no or only minor dynamic aspect of heating the heating surface. It may thus be easier to provide a homogeneous temperature distribution across the processing surface.

Vertical Cavity Surface Emitting Lasers (VCSEL) can be manufactured and tested in parallel on wafer scale such that a big number of VCSEL with very similar characteristics can be processed in one run. VCSEL emit less power than for example edge emitting lasers which are very well suited for high power applications. VCSELs may thus be advantageous if a big number of VCSELs is arranged such that at least 50 VCSEL illuminate an area element of the heating surface.

The heating system is adapted to heat the heating surface such that a first local temperature of a first part of a processing surface of a wafer deviates less than 0.5% from a second local temperature of a second part of the processing surface of the wafer being different from the first part of the processing surface such that the processing surface of the wafer is homogeneously heated to the intended temperature to process, for example, semiconductor layers. The intended temperature may be slightly different from the processing temperature if the heating surface and the processing surface are not the same.

Homogeneity of the temperature distribution is essential with respect to the growth conditions of, for example, semiconductor layers and therefore the characteristics of the final semiconductor device comprising part of the semiconductor layers. Blurring the emission of a big number of semiconductor light sources such that an area element of the heating surface is heated by means of at least 50 semiconductor light sources may enable such a homogeneous temperature distribution. The differences of single semiconductor light sources are averaged out. The averaging may be especially advantageous if the whole heating surface is illuminated at one moment in time. Local differences of the semiconductor light source may not play a role in this case. The heat distribution at the heating surface may in this case be that homogeneous that any two different non overlapping area elements on the processing surface of the wafer do essentially have the same temperature. The temperature between both area elements may deviate less than 0.2%, preferably less than 0.1% and more preferably less than 0.05%. This means for example that at a processing temperature of 1000° C. a temperature deviation between two arbitrary area elements of the processing surface of less than 2° C., preferably 1° C. and more preferably 0.5° C. may be reached by means of illuminating an area element of the heating surface by means of at least 50 semiconductor light sources.

The semiconductor light sources are arranged in sub modules, the heating system comprising an electrical driver, and the electrical driver is adapted to drive all semiconductor light sources of one sub module at the same time.

The sub modules may be adapted to heat the whole heating area in order to further increase the number of semiconductor light sources heating one area element of the heating surface. Alternatively or in addition different sub modules may be arranged to illuminate different area elements of the heating surface such that all sub modules together are adapted to heat the whole heating surface. The latter may be advantageous if there are local effects of or around the heating surface which may cause inhomogeneity which can be compensated by providing different optical power to different area elements of the heating surface. The electrical driver may in this case be arranged in a way that the different sub modules can be driven independently in order to vary the optical power emitted by the individual sub modules but it may also be possible that all sub modules are commonly driven and the sub modules are arranged to compensate heat dissipation caused by geometrical boundary conditions. The sub modules may, for example, comprise different numbers of semiconductor light sources heating the same area element of the heating surface.

The sub modules may provide the same or different intensity distributions. In case of a circular heating surface it may be advantageous to provide a first sub module with a circular intensity distribution for heating the center of the circular heating surface. A second sub module with a ring shape intensity distribution may be used to heat a ring around the center of the heating surface illuminated by means of the first sub module. The ring shaped intensity distribution may be used to compensate heat dissipation which may be caused by a, for example ring shaped suspension of the object. The intensity distributions may alternatively have a, for example, hexagonal shape such that the heating surface is covered by a hexagonal pattern of area elements illuminated by different sub modules. The hexagonal pattern may enable a local heating in order to provide a homogeneous heating of the complete heating surface.

The heating system may comprise according to another embodiment at least a first group of sub modules with at least one sub module and at least a second group of sub modules with at least one sub module, the first group of sub modules being adapted to heat the whole heating surface and the at least one sub module of the second group of sub modules being adapted to heat a part of the heating surface, and the electrical driver being adapted to drive the at least one sub module of the second group of sub modules independently from the sub module of the first group of sub modules.

The first group of sub modules may in this case be adapted to provide a basic heating of the heating surface. It may thus be advantageous to commonly drive the sub modules of the first group of sub modules by means of the electrical driver in order to simplify the architecture of the electrical driver. The sub modules may be adapted to heat different area elements of the heating surface and/or the area elements heated by means of different sub modules may overlap. It may even be advantageous that each sub module of the first group of sub modules is adapted to heat the whole heating surface. The number of semiconductor light sources illuminating one area element may be increased by letting the intensity distribution of the sub modules of the first group of sub modules overlap. Each sub module of the first group of sub modules may thus illuminate the whole heating surface. The first group of sub modules may provide 70%, 80%, 90% or even more than 95% of the total heating power needed to heat the heating surfaces to the processing temperature. The light distribution emitted by the sub modules may be adapted by means of optical elements like microlens arrays and/or lens arrangements.

The second group of sub modules may be adapted to provide the remaining heating power. The second group of sub modules may comprise one sub module in combination with a scanning arrangement in order to subsequently illuminate the whole heating surface. The scanning arrangement may comprise a mechanical carrier element carrying the sub module of the second group of sub modules such that the sub module of the second group of sub modules moves relative to the object with the heating surface. Alternatively or in addition a mechanical arrangement with a moveable mirror may be provided in order to move the optical power emitted by the sub module of the second group of sub modules across the heating surface. Furthermore, adaptable optical arrangements like, for example moveable lenses, may be used to change the intensity distribution provided by the sub module of the second group of sub modules on the heating surface. The sub module of the second group of sub modules provides the remaining optical power and may optionally compensate heat dissipation which may be caused by the arrangement of the object especially a suspension which may be needed to mount the object. The scanning modus and/or the intensity distribution needed to provide the optical power at certain area elements of the heating surface may be determined by means of thermal simulations and/or calibration runs.

The second group of sub modules may alternatively comprise two, three, four or more sub modules, each sub module of the second group of sub modules being adapted to heat an essentially different part of the heating surface such that the whole heating surface can be heated by means of the sub modules of the second group of sub modules, and wherein the electrical driver is adapted to drive each sub module of the second group of sub modules independently from the other sub modules of the second group of sub modules.

The sub modules of the second group of sub modules may provide the remaining optical power to homogeneously heat the heating surface to the processing temperature. One or more of the sub modules may be driven at different power levels in order to compensate local heating or cooling of the heating surface caused by the sub modules of the first group of sub modules.

The light distribution of one or more sub module of the second group of sub modules projected to the heating surface may partly overlap such that, for example, changes of the intensity in the boundary region of an intensity distribution provided by the sub modules of the second group of sub modules can be compensated. Overlapping of intensity distributions may further be used to compensate local heat dissipation which may be caused by, for example, a suspension by locally increasing the intensity.

The second group of sub modules may alternatively or in addition comprise two, three, four or more sub modules, each sub module of the second group of sub modules being adapted to heat the complete heating surface, wherein the sub modules of the second group of sub modules are adapted to provide a different intensity distribution on the heating surface, and wherein the electrical driver is adapted to drive each sub module of the second group of sub modules independently from the other sub modules of the second group of sub modules.

The different intensity distributions like, for example, circular and ring shaped intensity distributions as discussed above may be used to provide in combination with all other sub modules from all groups a homogenous temperature distribution across the heating surface by taking into account the geometry of the object and further geometric and material related boundary conditions.

The effort of determining the temperature distribution of the heating surface at a predefined processing temperature by means of simulations and/or calibration measurements may be high. Furthermore, it may be difficult to take changes of the boundary condition or fluctuations in material composition or geometry into account. It may thus be advantageous to provide temperature sensors measuring the temperature of certain area elements of the heating surface in order to control the semiconductor light sources. One or more temperature sensors may be assigned to one sub group of semiconductor light sources in order to provide a control parameter for controlling the sub group by means of the electrical driver. There may be, for example, a thermocouple provided at a suspension for mounting the object like a wafer or susceptor. The thermocouple or an arrangement of thermocouples may be adapted to measure the local temperature of the object next to the suspension. The measured temperature may be used to compensate, for example, heat dissipation caused by the suspension by adapting the driving parameters of the sub group of semiconductor light sources heating the respective area element of the heating surface. It may be possible to provide, for example, a susceptor with a multitude of temperature sensors across the heating surface in order to measure the temperature distribution of the heating surface of the susceptor. One or more of the thermocouples may be assigned to a sub module heating the respective area element of the heating surface. It may thus be possible to monitor the temperature distribution of the heating surface and immediately adapt the heating power of certain semiconductor light sources and/or one or more sub modules in order to correct in homogeneity of the temperature distribution.

The temperature measurement by means of sensors provided at or near to the heating surface may be difficult especially if the object is the wafer itself. It may thus be advantageous to use optical temperature sensors like pyrometer in order to determine the temperature distribution of the heating surface. The optical temperature sensors may be separate devices which may be coupled to the respective semiconductor light sources or sub module via the electrical driver. Alternatively or in addition it may be advantageous to integrate an optical temperature sensor in one or more sub modules. The optical temperature sensor would receive temperature information from the area element of the heating surface which is heated by the sub module comprising the respective temperature sensor.

It may thus be advantageous that in a further embodiment of the heating system at least a part of the sub module of the first group and/or the second group of sub modules comprises at least one temperature sensor being adapted to determine the temperature at a part of the heating surface illuminated by the respective sub module such that the homogeneity of the temperature distribution of the object can be monitored. It may be sufficient that only one sub module of the first group of sub modules comprises such a temperature sensor especially an optical temperature sensor in order to measure the temperature of one location of the heating surface. The size of the location may be determined by the optics used to project the light emitted by the sub modules or an independent/additional optic. The location may even be nearly point like or in the other extreme nearly comprise the whole area element illuminated by the respective sub module. Several or even all sub modules of the second group of sub modules may advantageously comprise one or more temperature sensors in order to determine the temperature of the area element of the heating surface illuminated by means of the respective sub module of the second group of sub modules. It may be sufficient that only some of the sub modules of the second group of sub modules comprise, for example an optical temperature sensor if different sub modules do have an overlapping intensity distribution on the heating surface. In case that all sub modules of the second group of sub modules emit light to essentially different area elements of the heating surface it may be advantageous that all sub modules comprise an optical temperature sensor for enabling a complete monitoring of the temperature distribution of the heating surface and a corresponding driving scheme of the sub modules of the second group of sub modules in order to minimize temperature differences.

Semiconductor light sources emit light of a limited wavelength spectrum. It may thus be advantageous that the temperature sensors are optical sensors measuring the temperature at a different wavelength as a wavelength of light emitted by the semiconductor light sources. The semiconductor light source may emit light at one specific wavelength or at two, three, four or more wavelengths. The semiconductor light sources may even emit light in a defined wavelength range.

The semiconductor light sources may emit light in the red or infrared part of the optical spectrum. Semiconductor lasers like VCSELs may, for example, be used as semiconductor light sources. VCSEL may emit laser light at an essentially single wavelength in the wavelength range between 800 nm and 1200 nm. The optical temperature sensors may measure the temperature of the heating surface at a wavelength of, for example, 500 nm or 700 nm or above the emission wavelength of the VCSEL. The emission of the VCSELs at a wavelength of, for example, 850 nm may thus not disturb the optical detection of the temperature. In a simple case the pyrometer can be realized by a photodiode sensitive to long wavelengths (e.g. equipped with an optical long pass filter) and being part of the VCSEL assembly i.e. replacing a number of VCSEL chips on a joined mounting surface.

The wavelength or range of wavelength used for measuring the temperature may be chosen in dependence of the material of the object and especially the heating surface. A thin GaAs or Si wafer for example is nearly transparent in the infrared spectrum such that measurement at shorter wavelength of around 700 nm may be preferred in order to avoid negative influence by means of the layers grown on the processing surface. Furthermore, filters blocking infrared radiation may cause measurements at shorter wavelength.

It may be further advantageous that the temperature distribution of the processing surface may be monitored in addition if the processing surface and the heating surface do not at least partly coincide. Monitoring the processing surface may in this case be used to further increase the homogeneity of the temperature distribution of the processing surface.

The heating system may in an advantageous embodiment comprise at least 50000, 100000, 500000 or even more semiconductor light sources. Using more semiconductor light sources for heating a heating surface of a defined area size increases the number of semiconductor light sources heating one area element of the heating surface. The reliability of the heating system may be improved because a malfunction of one semiconductor light source may be negligible in comparison to the total optical power emitted to heat the respective area element of the heating surface.

As semiconductor light sources may be expensive, it may be advantageous that the heating system may comprise a heating module for providing a first temperature distribution of heating surface of the object and the semiconductor light sources are adapted to provide a homogeneous temperature distribution at the processing temperature. The heating module may comprise conventional heating devices like, for example, halogen lamps for heating the heating surface to a temperature near to the processing temperature. The semiconductor light sources are used to compensate inhomogeneity which may be caused by the heating module and/or the geometrical boundary condition. The semiconductor light sources may be arranged in sub modules like the sub modules of the second group of sub modules as discussed above in order to compensate local differences of the temperature of the heating surface. The combination of a conventional heating module with semiconductor light sources may be cheaper than a heating system comprising only semiconductor light source. It may be a disadvantage of such a combined system that temperature measurement by means of optical temperature sensors may be disturbed by means of the broadband emission of the, for example, halogen lamps.

A reactor for wafer processing may comprise a heating system as described above and a reactor chamber, wherein the heating system is adapted to heat at least one wafer within the reactor chamber. The heating system may be positioned at the inside of the reactor chamber. It may be advantageous to separate the heating system from the object. A glass plate with a light-transmissive coating for the light emitted by the semiconductor light sources but reflective for longer wavelengths thermal radiation from the object may facilitate as thermal separation thus reducing the required heating power. A further separation may avoid a direct gas flow between the reactor chamber and the semiconductor light sources of the heating system. This may be realized by a membrane like construction and two separate vacuum systems but still inside the reactor chamber i.e. at the same low pressure.

Alternatively, it may be advantageous to arrange the heating system outside the reactor chamber. The reactor chamber may comprise in this case at least one reactor window, and the heating system is adapted to heat the wafer by irradiating light via the reactor window. A complete separation of the heating system from the reactor chamber may have the advantage that, for example, the heating system has not to be adapted to the conditions in the reactor chamber. Furthermore, maintenance operations which are only related to the heating system may be independent from the reactor chamber such that, for example, the vacuum within the reactor chamber can be maintained. Recalibration of the deposition system as, for example, in a MOCVD or MBE reactor may not be necessary such that the time needed for the maintenance operation may be reduced.

Semiconductor light source like VCSELs are advantageously combined with such reactor windows because the semiconductor light sources emit the light in a relatively small solid angle. VCSEL do have a halve divergence angle of less than 10° such that it may be possible to place the semiconductor light source outside the reactor chamber without any additional optics. The divergence angle is defined as the angle where the intensity emitted by a semiconductor light source is reduced to $1/e^2$ of the maximum intensity emitted by specific light source (e Euler number 2, 71 . . . ). The reactor windows may even be used as optical element to project the intensity distribution emitted by the respective semiconductor light sources which may be arranged in sub modules to the heating surface of the object. The geometry of the sub module may be adapted to the geometry of the shape of the reactor window. A sub module comprising semiconductor light sources in a circular arrangement may, for example, be combined with circular reactor windows which may additionally be arranged as lenses. The reactor chamber may comprise one reactor window for each sub module.

According to a further aspect of the present invention a method of heating a heating surface of an object to a processing temperature of at least 100° C. is provided. The method comprises the steps of:
providing a heating surface of an object;
providing semiconductor light sources, wherein the semiconductor light sources are Vertical Cavity Surface Emitting Lasers;
arranging the semiconductor light sources in sub modules;

providing an electrical driver;
adapting the electrical driver to drive all semiconductor light sources of one sub module simultaneously;
adapting the heating system to heat the heating surface such that a first local temperature of a first part of a processing surface of a wafer deviates less than 0.5% from a second local temperature of a second part of the processing surface of the wafer being different from the first part of the processing surface by arranging the sub modules and/or the electrical driver;
heating an area element of the heating surface with at least 50 semiconductor light sources at the same time such that the processing surface of the wafer is homogeneously heated to a defined temperature.

The method may enable a homogeneous and reliable heating of the heating surface of the object.

The method may comprise the further steps of:
providing temperature sensors for measuring the temperature of different area elements of the heating surface;
measuring the temperatures of the different area elements of the heating surface;
controlling the semiconductor light sources by means of the temperature measured by the temperature sensors such that temperature differences of the heating surface of the object are reduced.

It shall be understood that the heating system of claim 1 and the method of claim 15 have similar and/or identical embodiments, in particular, as defined in the dependent claims.

It shall be understood that a preferred embodiment of the invention can also be any combination of the dependent claims with the respective independent claim. Especially the reactor as claimed in claims 10 to 12 may be combined with any heating system of the claims 1-9.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first embodiment of a heating system

Figure 2:
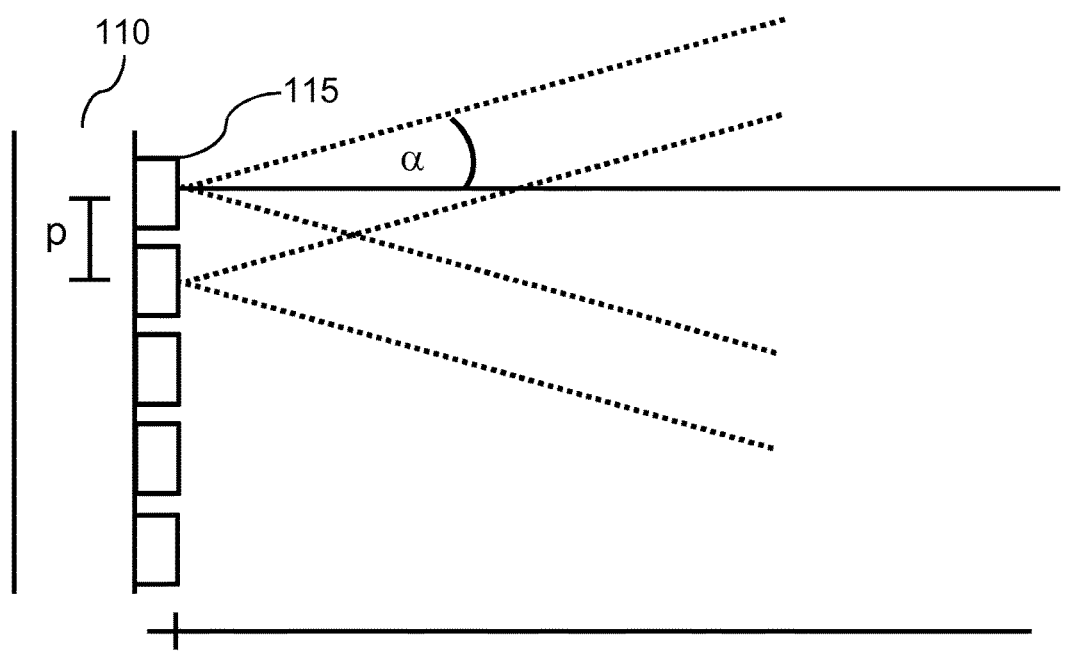
Figure 3:
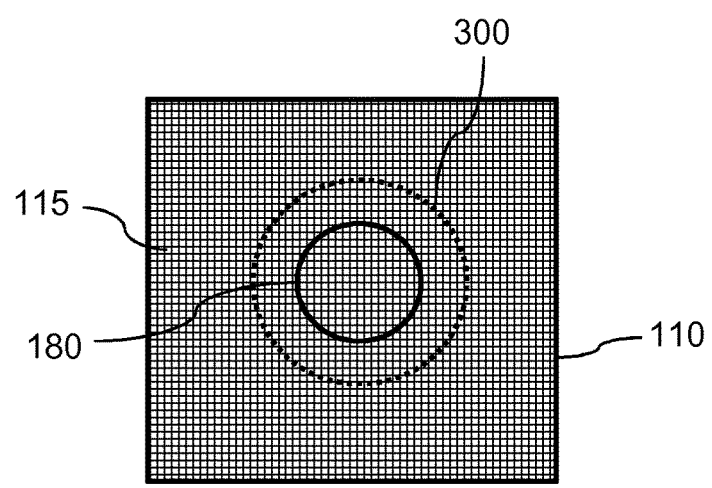
Figure 4:
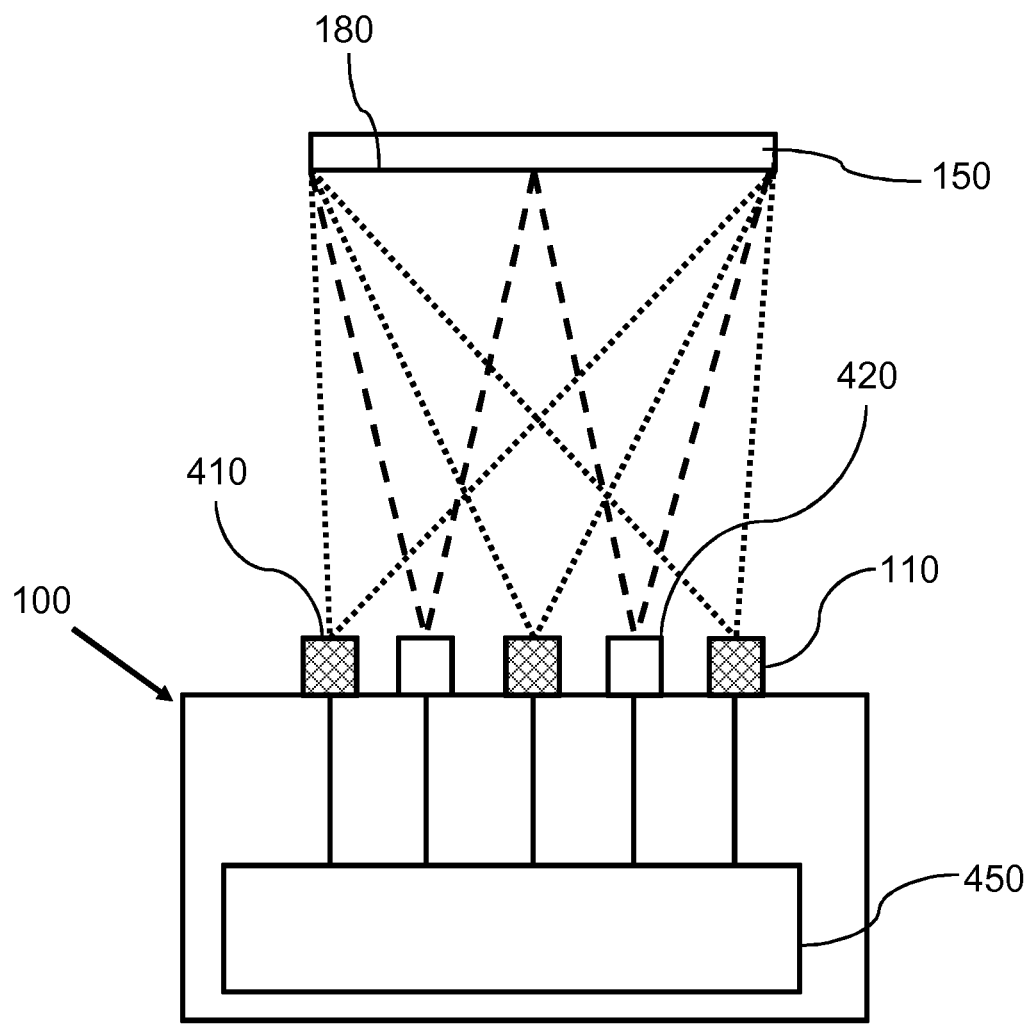
Figure 5:
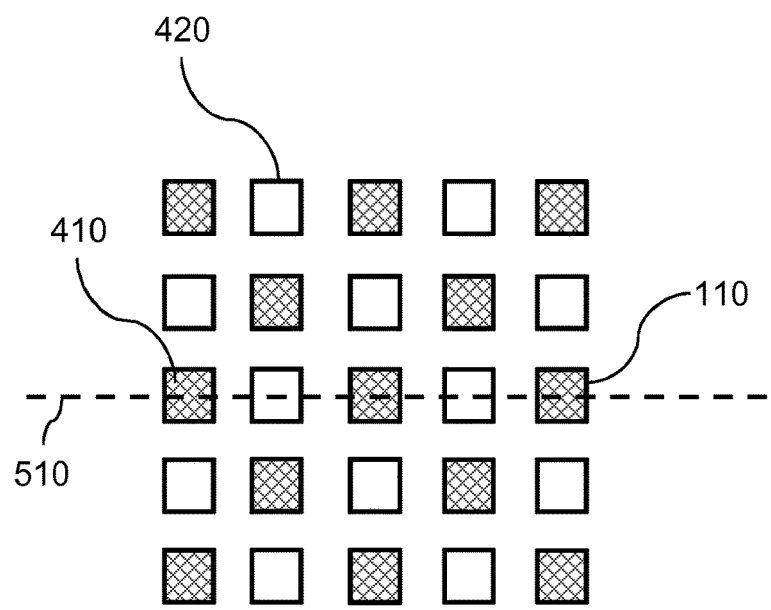
Figure 6:
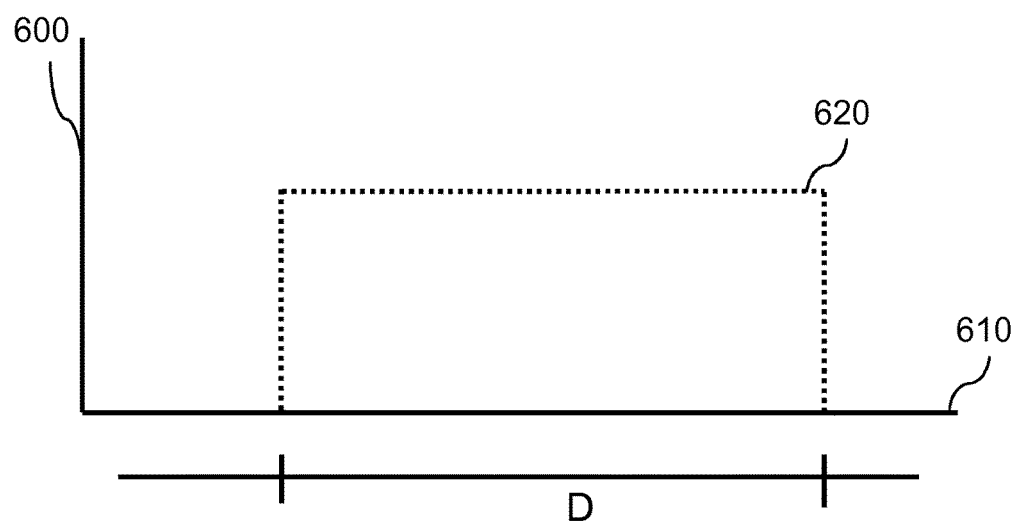

FIG. 2 shows a principal sketch for illustrating the principal of overlapping light cones FIG. 3 shows a principal sketch of a second embodiment of a heating system FIG. 4 shows a principal sketch of a cross section of a third embodiment of a heating system FIG. 5 shows a principal sketch of a top view of the third embodiment of a heating system FIG. 6 shows an intensity profile provided by a sub module of the first group of sub modules shown in FIGS. 4 and 5.

Figure 7:
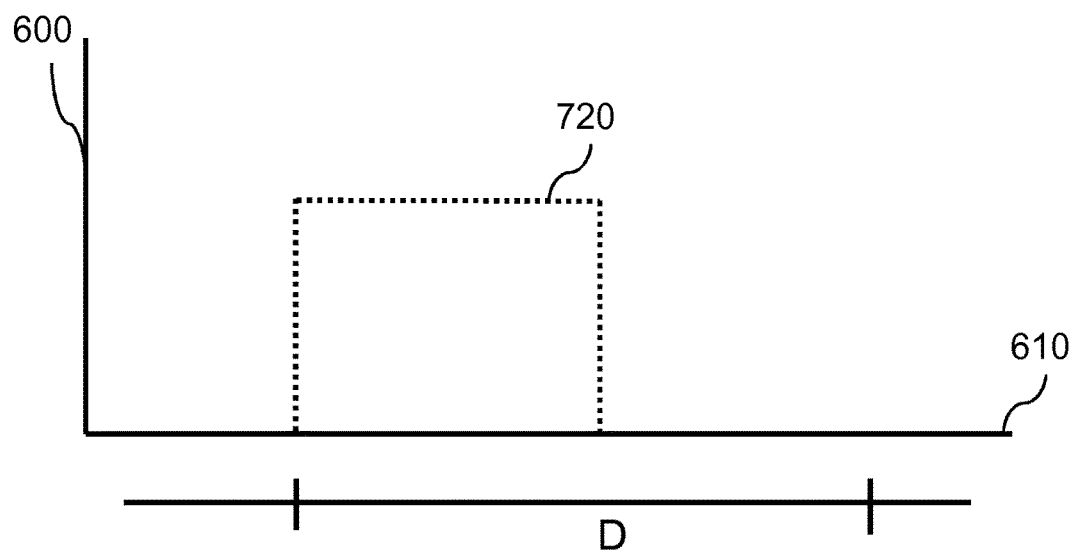
Figure 8:
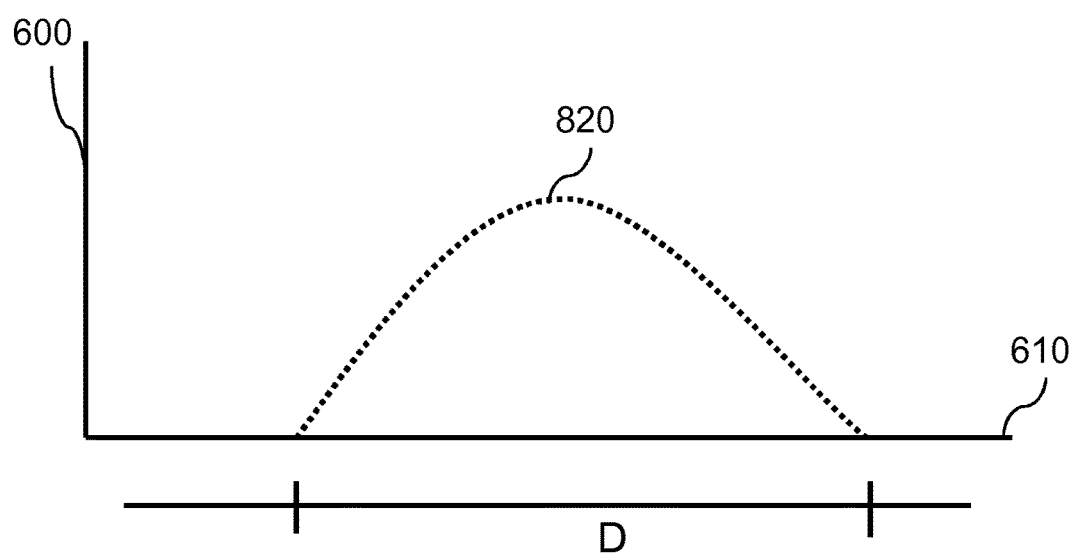
Figure 9:
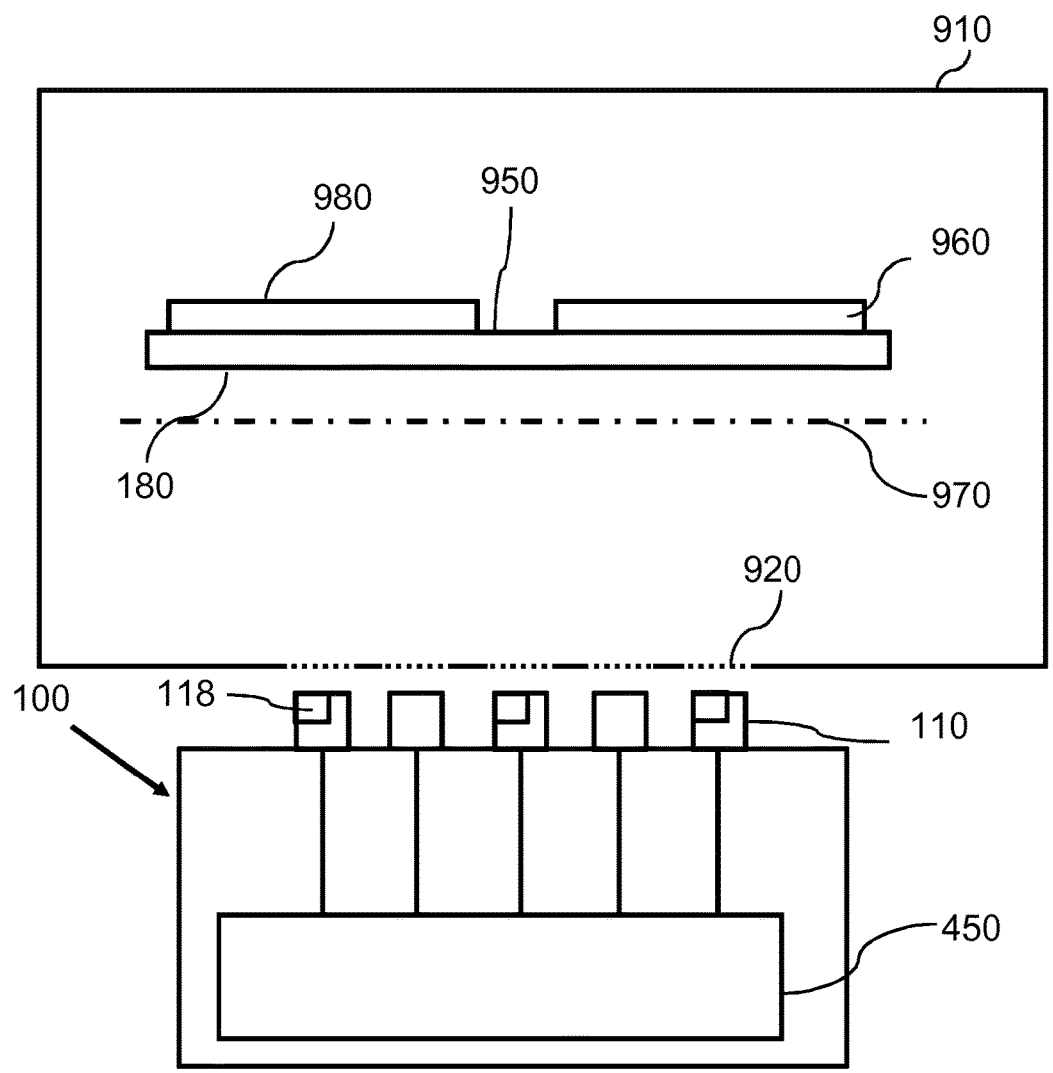
Figure 10:
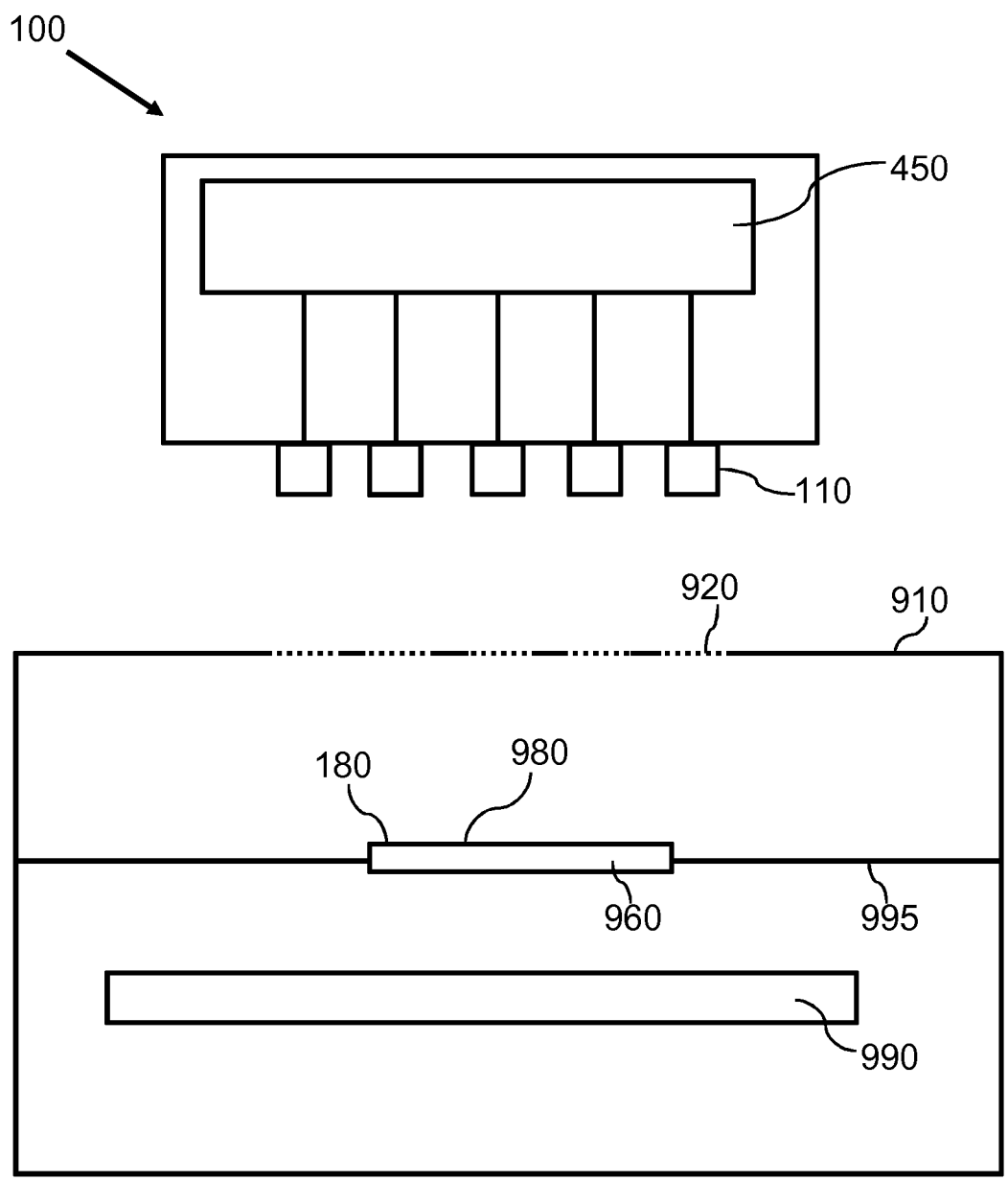
Figure 11:
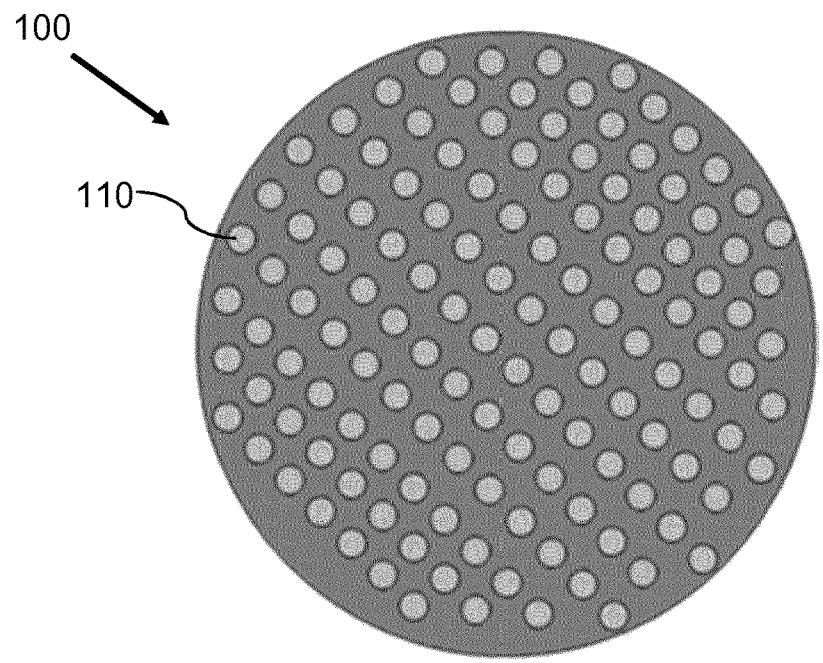
Figure 12:
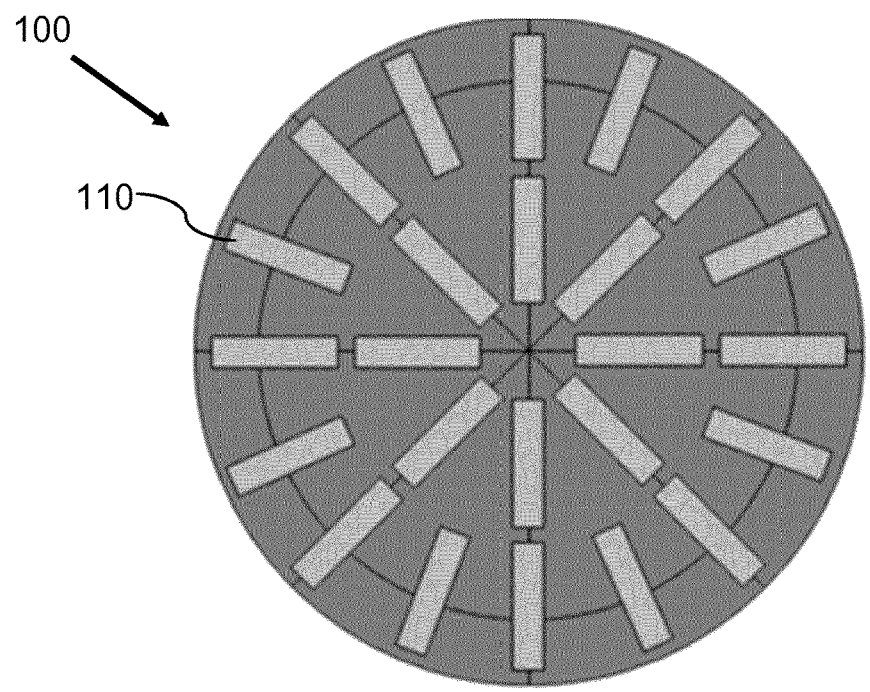
Figure 13:
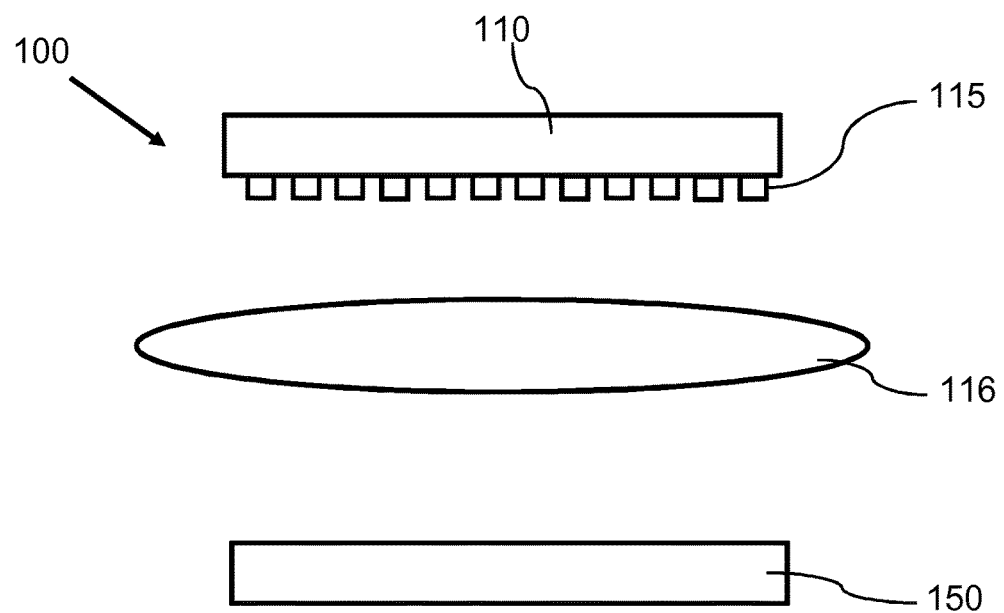
Figure 14:
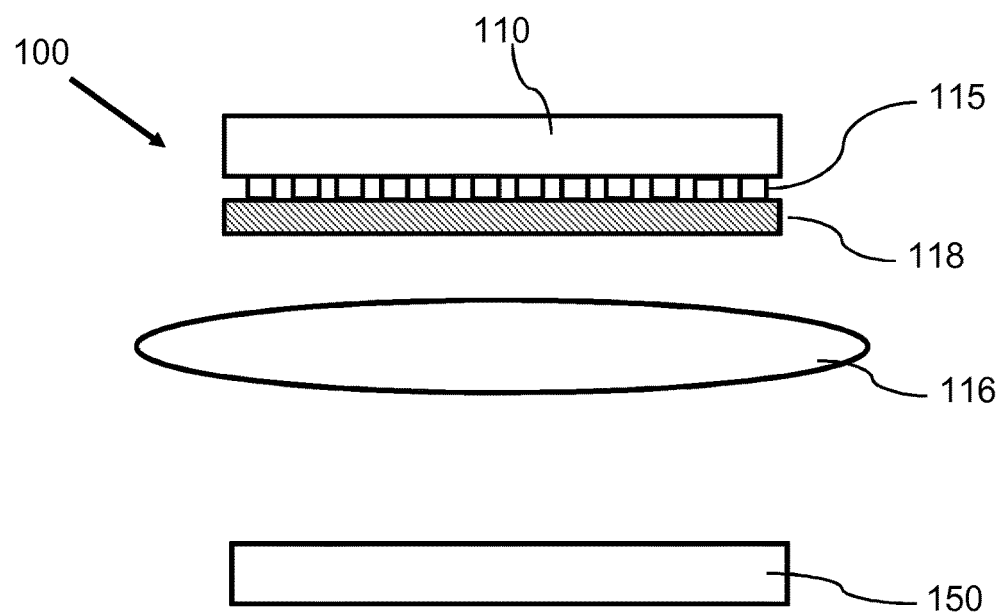
Figure 15:
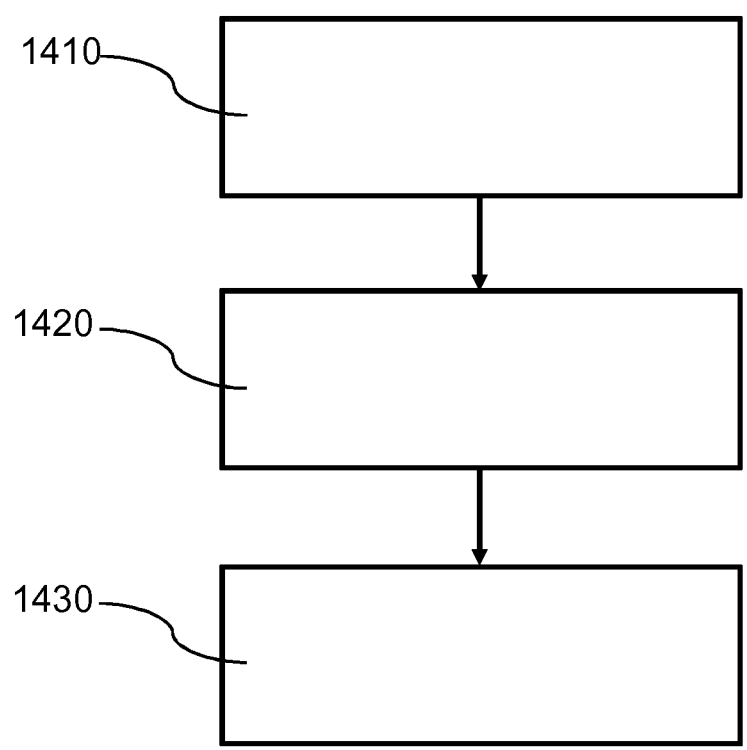

FIG. 7 shows an intensity profile provided by a sub module of the second group of sub modules according to a first embodiment FIG. 8 shows an intensity profile provided by a sub module of the second group of sub modules according to a second embodiment FIG. 9 shows a principal sketch of a first embodiment of a reactor FIG. 10 shows a principal sketch of a second embodiment of a reactor FIG. 11 shows a principal sketch of an arrangement of sub modules according to a first embodiment FIG. 12 shows a principal sketch of an arrangement of sub modules according to a second embodiment FIG. 13 shows a principal sketch of a fourth embodiment of a heating system FIG. 14 shows a principal sketch of a fifth embodiment of a heating system FIG. 15 shows a principal sketch of method steps of a method of heating a heating surface of an object In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
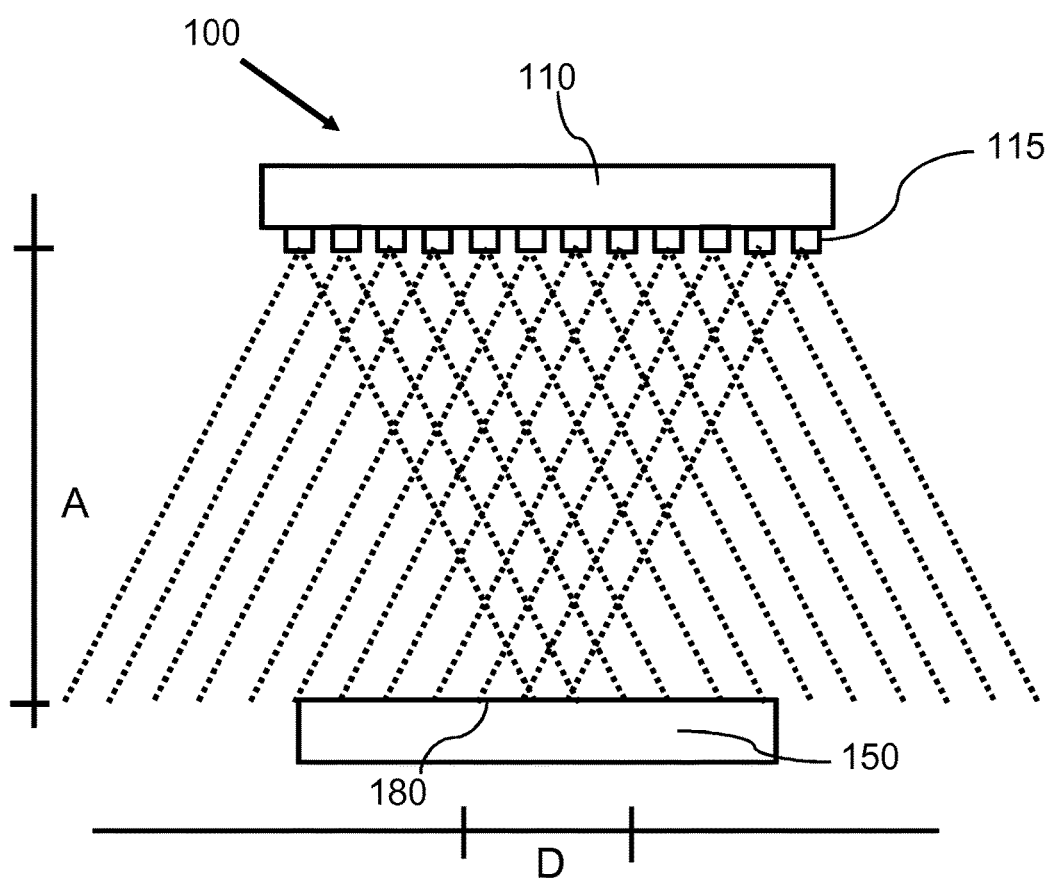

FIG. 1 shows a principal sketch of a cross section of a first embodiment of a heating system 100. The heating system comprises one sub module 110 with a multitude of semiconductor light sources 115 like VCSEL. The VCSEL emit laser light to an object 150 with a heating surface 180 with a diameter D at a distance A to the light emitting surface of the VCSEL. The heating surface 180 does not cover the entire upper surface of the object 150 next to the VCSEL. The distance A, the pitch between the VCSELs and the halve divergence angle $\alpha$ of the VCSEL are arranged such that an area element of the heating surface 180 is illuminated by means of at least 50 VCSEL. The divergence angle is defined as the angle where the intensity emitted by a semiconductor light source is reduced to $1/e^2$ of the maximum intensity emitted by specific light source (e Euler number 2, 71 . . . ).

For a square arrangement of the light sources with the pitch p this can be achieved by fulfilling the equation $\pi (A \tan \alpha)^2 > 50p^2$. The area elements of the heating surface 180 are in this case a concentric circle and rings around the center of the heating surface 180.

FIG. 2 shows a principle sketch for illustrating the principle of overlapping light cones. The figure shows only a section of a sub module 110. The semiconductor light sources 115 of the sub module 110 are arranged in a quadratic pattern with a pitch p. The semiconductor light sources emit light with a divergences angle $\alpha$. The radius R of the cone of light emitted by one semiconductor light source 115 at a distance A at which the light of at least 50 adjacent semiconductor light sources 115 overlap, assuming a nearly uniform distribution of much more than 50 light sources 115 on the sub module 110, is approximately $R = \sqrt{(50/\pi)} * p.$ The minimum distance A at which the object 150 with the heating surface has to be placed is determined by $A = R/\tan(\alpha).$ The minimum distance at which the object has to be placed is thus determined by the divergence angle $\alpha$ and the pitch p of the semiconductor light sources. The example given above is a specific one discussed for illustrative purpose only. Calculations depend on the arrangement of the semiconductor light sources, intensity distribution of the semiconductor light sources (VCSEL, VCSEL array) etc. The divergence angle may, for example, be influenced by providing a micro lens array collimating the light of each semiconductor light source 115.

FIG. 3 shows a principal sketch of a second embodiment of a heating system 100. The heating system 100 is shown from the perspective of the heating surface 180 of the object 150. The area 300 of the heating surface 180 illuminated by one semiconductor light source 115 is indicated by the dotted circle representing the line at which $1/e^2$ of the maximum intensity received by the heating surface from the respective semiconductor light source is received. The semiconductor light sources 115 are indicated as squares on the sub module 110. Taking an area element near or at the center of the heating surface 180 (e.g. one of the squares), it's obvious that the light emitted by much more than 50 semiconductor light sources 115 overlaps at the respective area element of the heating surface 180. The minimum size of the sub module 110 in order to provide a homogeneous illumination has in this embodiment to be at least equal to the sum of the diameter of the heating surface 180 and the diameter of the area 300. Light emitted by semiconductor light sources 115 which does not hit the heating surface may hit the remaining surface of the object 150 (if there is such a remaining surface) or additional masks may be used to absorb this light. Alternatively or in addition microlens arrays may be provided directing light emitted at the rim of the sub module 110 near to the rim of the heating surface 180. The microlens array may be adapted in this case such that the intensity across the heating surface 180 is essentially constant.

FIG. 4 shows a principal sketch of a cross section of a third embodiment of a heating system. FIG. 5 shows a top view of the heating system 100 shown in FIG. 4 wherein the dashed line 510 indicates the line of the cross section shown in FIG. 4. Two groups of sub modules 110 with a multitude of semiconductor light sources are shown. Each sub module 110 of the first group of sub modules 410 emits light covering the whole heating surface 180 of the object 150 as indicated by the dotted lines. An idealized example of an intensity profile 620 provided by a sub module 110 of the first group of sub modules 410 is shown in FIG. 6. The intensity is essentially constant across the diameter D of the heating surface 180. In reality the intensity profile may be trapezoidal such that the area of constant intensity has to cover the whole heating surface 180. The sub modules 110 of the second group of sub modules 420 emits light covering only parts of the heating surface 180 of the object 150 as indicated by the dashed lines. An idealized example of an intensity profile 720 provided by a sub module 110 of the second group of sub modules 420 is shown in FIG. 7. The intensity is essentially constant across halve of the diameter D of the heating surface 180. A simple optic may be sufficient in this embodiment to project the near field emission of the quadratic sub modules 110 such that an essentially rectangular intensity profile is projected to the heating surface 180 as indicated in FIG. 7. Such optics and more sophisticated optics are well known to those skilled in the art. The optical elements may be chosen depending on the geometric boundary conditions and the intended intensity profile. The different sub modules 110 of the second group of sub modules 420 are arranged such that adjacent area elements of the heating surface 180 are illuminated. Overall the whole heating surface 180 is illuminated by means of the sub modules 110 of the second group of sub modules 420. The sub modules 110 are electrically powered by means of an electrical driver 450 being integrated in the heating system 100. The sub modules 110 of the first group of sub modules 410 are commonly driven and provide around 95% of the optical power needed to heat the heating surface 180 to the processing temperature. The remaining optical power is provided by means of the sub modules 110 of the second group of sub modules 420. The sub modules 110 of the second group of sub modules 420 are independently driven by means of the electrical driver 450 such that temperature differences between different area elements of the heating surface 180 can be minimized. Such temperature differences may, for example be caused by a suspension (not shown) at the rim of the object 150. It may be even advantageous to provide as much power (e.g. 98% or 99%) by means of the first group of sub modules 410 such that the sub modules of the second group of sub modules 420 only need to provide the fine tuning in order to provide a constant temperature of the heating surface.

FIG. 8 shows an intensity profile 820 provided by a sub module 110 of the second group of sub modules 420 according to a second embodiment. The intensity profile has a maximum at the center of the heating surface 180 and decrease to zero intensity at the rim of the heating surface 180. The other sub modules 110 of the second group of sub modules 420 emit a ring shaped intensity profile with two maxima symmetrically arranged around the center of the heating surface 180. The intensity profile is in this case adapted to a circular susceptor. The optical power provided by the different sub modules 110 of the second group of sub modules 420 can be varied in order to compensate heat losses which may be caused by a ring shaped suspension (not shown) for mounting the susceptor. In general the intensity profiles have to be adapted by means of the arrangement of the semiconductor light sources 115 within one sub module 110 (distances between single semiconductor light sources 115, varying density of semiconductor light sources 115 etc. . . . ), optical elements (micro lens arrays, lenses etc. . . . ) in order to match the boundary conditions which are given by the object 150 (shape, material, structure etc. . . . ) and supporting elements like suspensions and the like. In general each influence (e.g. gas flow) has to be taken into account which may cause a temperature deviation of the heating surface 180. Furthermore, the relative arrangement of the sub modules 110 may be used to provide a homogeneous temperature distribution at the heating surface 180.

FIG. 9 shows a principal sketch of a first embodiment of a reactor comprising a heating system 100. The heating system 100 is similar to the heating system shown in FIGS. 4 and 5 and comprises sub modules 110 which are independently driven by means of an electrical driver 450. Every second sub module 110 comprises a temperature sensor 118 (pyrometer) for measuring the surface temperature of an area element of the heating surface 180 illuminated by means of the respective sub module 110. The sub modules 110 comprise VCSEL arrays emitting laser light at a wavelength of around 850 nm. The laser light passes reactor windows 920 of a reactor chamber 910 and a coated glass plate 970 which is transparent at the laser wavelength but reflective at lower wavelengths in order to reduce thermal losses by means of thermal radiation. The object 150 is in this case a susceptor 950 on which wafers 960 are placed. The susceptor 950 and the wafers 960 are placed within the reactor chamber. The laser light emitted by the sub modules 110 is absorbed at the lower surface of the susceptor 950 being opposite to the surface on which the wafers 960 are placed. The lower surface of the susceptor 950 is identical with the heating surface 180. The sub modules 110 emit laser light with overlapping intensity profiles wherein the intensity profiles are arranged such that a homogeneous heating of the heating surface 180 is enabled. The heating surface 180 is heated to the processing temperature and the wafers 960 are indirectly heated via the susceptor 950 which may be made of graphite. The homogeneity of the temperature of the heating surface is controlled by means of the pyrometer operating at a wavelength of 700 nm. The sub modules 110 are controlled by means of the electrical driver based on the input provided by the pyrometers. The deposition of the semiconductor layers starts as soon as a homogeneous and stable temperature of the heating surface 180 and consequently the processing surface on the upper side of the wafers 960 is reached.

FIG. 10 shows a principal sketch of a second embodiment of a reactor with a heating system 100. Sub modules 110 comprise VCSEL arrays emitting laser light at a wavelength of around 850 nm. The laser light passes reactor windows 920 of a reactor chamber 910 and hits the processing surface 980 of a wafer 960. The processing surface 980 is in this case (different to the embodiment shown in FIG. 9) essentially identical with the heating surface 180. The wafer 960 is mounted by means of a suspension 995. The main heating of the wafer is provided by means of a heating module 990 comprising conventional halogen lamps. The heating module 990 is arranged within the reactor chamber on the opposite side of the wafer relative to the processing surface 980 absorbing the laser light.

Each sub module 110 is individually driven by means of an electrical driver and emits laser light to a defined area element of the heating surface 180 such that local temperature variations can be compensated. The area element illuminated by a first sub module 110 may only slightly overlap with an area element illuminated by a second sub module 110. The smaller the area elements are the better may be the control of the homogeneity of the temperature of the processing surface 980. The area elements may have different sizes because temperature control near to structural elements like the suspension which may cause heat dissipation may be more important than several area elements near to the center of the wafer.

FIG. 11 shows a principal sketch of an arrangement of sub modules 110 according to a first embodiment. The sub modules 110 of the heating system 100 have a circular shape and are provided in a regular pattern. Each of the sub modules is individually powered by means of an electrical driver 450. The driving scheme of the sub modules may take into account the heat flow within the object using, for example, pulse driving. Adjacent sub modules may, for example, not emit light at the same time. The latter may, for example, be advantageous in case of indirect heating of a processing surface via a susceptor as shown in FIG. 9.

FIG. 12 shows a principal sketch of an arrangement of sub modules 110 according to a second embodiment. The sub modules have a rectangular shape being radially arranged with the long side of the rectangle. The center lines of the rectangles point to the center of the circular heating system 100. Optical elements are provided in order to enable a homogeneous heating of the heating surface 180.

FIG. 13 shows a principal sketch of a fourth embodiment of a heating system 100. A sub module 110 with semiconductor light sources 115 is combined with an optical element 116 (convex lens) in order to provide a defined intensity distribution on a heating surface 180 of an object 150.

FIG. 14 shows a principal sketch of a fifth embodiment of a heating system 100. A sub module 110 with semiconductor light sources 115 (VCSELs) is combined with a microoptical element 117 (microlens array) and an optical element 116 (convex lens) in order to provide a defined intensity distribution on a heating surface 180 of an object 150. The microlens array may, for example, be used to change the divergence angle of the emitted laser light such that the distance to the object 150 may be extended.

FIG. 15 shows a principal sketch of method steps of a method of heating a heating surface 180 of an object 150. In step 1410 a heating surface 180 of an object 150 is provided. In step 1420 semiconductor light sources 115 are provided. The heating surface 180 is heated by means of light emitted by the semiconductor light sources 115 in step 1430 such that an area element of the heating surface 180 receives light of at least 50 semiconductor light sources 115 at the same time.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100 heating system
110 sub module
115 semiconductor light source
116 optical element
117 microoptical element
118 temperature sensor
150 object
180 heating surface
300 area of the heating surface illuminated by one semiconductor light source
410 first group of sub modules
420 second group of sub modules
450 electrical driver
510 line indicating cross section
600 intensity
610 cross section across the heating surface of the object
620 intensity profile provided by a sub module of the first group of sub modules
720 intensity profile provided by a sub module of the second group of sub modules according to a first embodiment
820 intensity profile provided by a sub module of the second group of sub modules according to a second embodiment
910 reactor chamber
920 reactor window
950 susceptor
960 wafer
970 coated glass plate
980 processing surface
990 heating module
995 suspension
1410 method step of providing a heating surface of an object
1420 method step of providing semiconductor light sources 1430 method step of heating an area element of the heating surface

The invention claimed is:

1. A method of heating a heating surface of an object to a processing temperature of at least 100° C., the method comprising:
providing a heating surface of an object;
providing semiconductor light sources wherein the semiconductor light sources are Vertical Cavity Surface Emitting Lasers;
arranging the semiconductor light sources in sub modules;
providing an electrical driver;
adapting the electrical driver to drive all semiconductor light sources of one sub module simultaneously;
adapting the heating system to heat the heating surface such that a first local temperature of a first part of a processing surface of a wafer deviates less than 0.5% from a second local temperature of a second part of the processing surface of the wafer being different from the first part of the processing surface by arranging at least one of the sub modules and the electrical driver;
heating an area element of the heating surface with at least 50 semiconductor light sources at the same time such that the processing surface of the wafer is homogeneously heated to a defined temperature.

2. A heating system for heating a heating surface of an object, comprising:
a plurality of semiconductor light sources, wherein an area element of the heating surface is heated with at least 50 semiconductor light sources simultaneously, the semiconductor light sources being Vertical Cavity Surface Emitting Lasers, wherein the heating surface is heated such that a first local temperature of a first part of a processing surface of a wafer deviates less than 0.5% from a second local temperature of a second part of the processing surface of the wafer, the second part being different from the first part, the semiconductor light sources being arranged in sub modules; and
an electrical driver configured to drive the semiconductor light sources of each sub module simultaneously, wherein the sub modules and the electrical driver are arranged such that the processing surface of the wafer is homogeneously heated to a predefined temperature, a processing temperature being at least 100° C.

3. A reactor for wafer processing, comprising:
a heating system for heating a heating surface of an object that includes:
a plurality of semiconductor light sources, wherein an area element of the heating surface is heated with at least 50 semiconductor light sources simultaneously, the semiconductor light sources being Vertical Cavity Surface Emitting Lasers, wherein the heating surface is heated such that a first local temperature of a first part of a processing surface of a wafer deviates less than 0.5% from a second local temperature of a second part of the processing surface of the wafer, the second part being different from the first part, the semiconductor light sources being arranged in sub modules;
an electrical driver configured to drive the semiconductor light sources of each sub module simultaneously, wherein the sub modules and the electrical driver are arranged such that the processing surface of the wafer is homogeneously heated to a predefined temperature, a processing temperature being at least 100° C.; and
a reactor chamber, wherein the heating system is configured to heat at least one wafer within the reactor chamber.

4. The heating system according to claim 2, wherein the heating system comprises at least a first group of sub modules with at least one sub module and at least a second group of sub modules with at least one sub module, the first group of sub modules being adapted to heat the whole heating surface, and the at least one sub module of the second group of sub modules being adapted to heat a part of the heating surface, and the electrical driver being adapted to drive the at least one sub module of the second group of sub modules independently from the sub module of the first group of sub modules.

5. The heating system according to claim 4, wherein the second group of sub modules comprises at least two sub modules, each sub module of the second group of sub modules being adapted to heat a different part of the heating surface such that the whole heating surface is heated by the sub modules of the second group of sub modules, and wherein the electrical driver is adapted to drive each sub module of the second group of sub modules independently from the other sub modules of the second group of sub modules.

6. The heating system according to claim 4, wherein the second group of sub modules comprises at least two sub modules, each sub module of the second group of sub modules being adapted to heat the complete heating surface, wherein the sub modules of the second group of sub modules are adapted to provide a different intensity distribution on the heating surface, and wherein the electrical driver is adapted to drive each sub module of the second group of sub modules independently from the other sub modules of the second group of sub modules.

7. The heating system according to claim 5, wherein at least a part of the sub modules of the first group or the second group of sub modules comprises at least one temperature sensor being adapted to determine the temperature at a part of the heating surface illuminated by the respective sub module such that the homogeneity of the temperature distribution of the object can be monitored.

8. The heating system according to claim 7, wherein the temperature sensors are optical sensors measuring the temperature at a different wavelength as a wavelength of light emitted by the semiconductor light sources.

9. The heating system according to claim 2, wherein the heating system comprises at least 50000 semiconductor light sources.

10. The heating system according to claim 2, wherein the heating system is adapted such that the intensity distribution provided by the semiconductor light sources scans the heating surface of the object.

11. The heating system according to claim 2, wherein the heating system comprises a heating module for providing a first temperature distribution of the object, and the heating module and the semiconductor light sources are adapted to provide a homogeneous temperature distribution at the processing temperature.

12. The reactor according to claim 3, wherein the reactor chamber comprises at least one reactor window, and the heating system is adapted to heat the wafer by irradiating light via the reactor window.

13. The reactor according to claim 12, wherein the reactor chamber comprises one reactor window for each sub module.

* * * * *